United States Patent
Chokan et al.

(10) Patent No.: US 8,625,355 B2
(45) Date of Patent: Jan. 7, 2014

(54) SEMICONDUCTOR MEMORY DEVICE AND METHOD OF OPERATING THE SAME

(75) Inventors: Tomohito Chokan, Yokohama (JP); Naoaki Sudou, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 115 days.

(21) Appl. No.: 13/316,608

(22) Filed: Dec. 12, 2011

(65) Prior Publication Data

US 2012/0155186 A1   Jun. 21, 2012

(30) Foreign Application Priority Data

Dec. 20, 2010   (JP) .................................. 2010-283607

(51) Int. Cl.
  *G11C 16/06*   (2006.01)
(52) U.S. Cl.
  USPC ................. 365/185.22; 365/185.25; 365/200; 365/201; 365/203
(58) Field of Classification Search
  USPC ................. 365/185.22, 185.25, 200, 201, 203
  See application file for complete search history.

(56) References Cited

U.S. PATENT DOCUMENTS

| | | | | |
|---|---|---|---|---|
| 7,738,296 B2 * | 6/2010 | Lin | .......................... | 365/185.11 |
| 8,365,030 B1 * | 1/2013 | Choi et al. | ..................... | 714/746 |
| 2005/0286308 A1 * | 12/2005 | Nagashima | .............. | 365/185.22 |
| 2009/0003058 A1 * | 1/2009 | Kang | ....................... | 365/185.03 |

FOREIGN PATENT DOCUMENTS

JP   2010-027141   2/2010

* cited by examiner

*Primary Examiner* — Connie Yoha
(74) *Attorney, Agent, or Firm* — Volentine & Whitt, PLLC

(57) ABSTRACT

A semiconductor memory device operate during a program verification operation to apply a read voltage to a word line and a pre-charge voltage to a bit line in order to provide output data. A number of fail cells is determined in view of the output data, wherein the number of fail cells is directly related to an increase in voltage on a common source line (CSL) connected to memory cells providing the output data. During a subsequent program verification operation, the level of at least one of the read voltage and the pre-charge voltage is adjusted in response to the number of fail cells.

20 Claims, 13 Drawing Sheets

Fig. 2
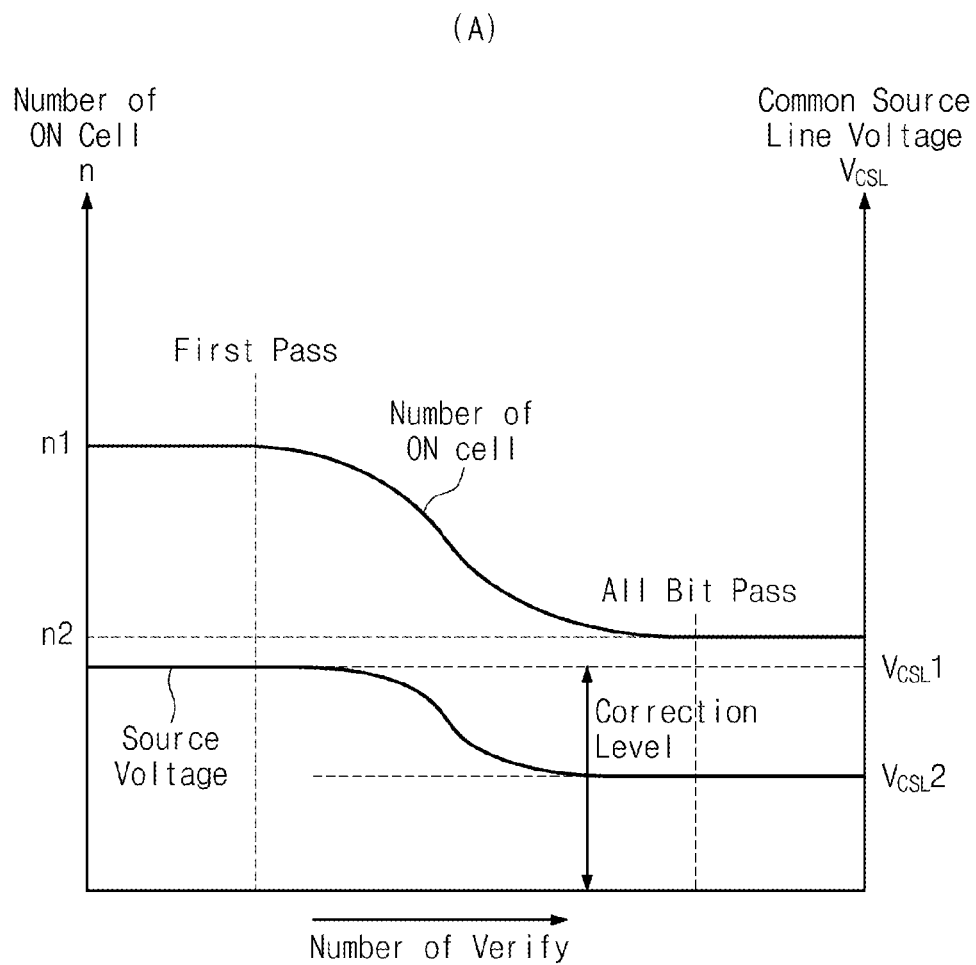
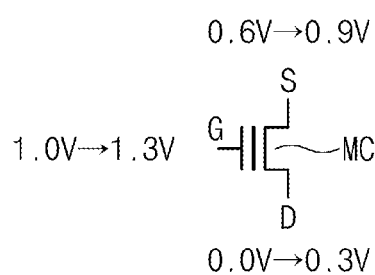

SEMICONDUCTOR MEMORY DEVICE AND METHOD OF OPERATING THE SAME

CROSS-REFERENCE TO RELATED APPLICATIONS

This U.S. non-provisional patent application claims priority under 35 U.S.C. §119 to Japanese Patent Application No. 2010-0283607 filed on Dec. 20, 2010, the subject matter of which is hereby incorporated by reference.

BACKGROUND OF THE INVENTION

The present inventive concept relates to semiconductor memory devices and methods of operating the same.

Nonvolatile memory devices have the capability of retaining stored data in the absence of applied power. There are different types of nonvolatile memory devices. However, so-called flash memory, including several types of electrically erasable nonvolatile memory, has become an important component of many contemporary digital data and consumer electronics devices. NAND type flash memory is configured using a plurality of memory strings, wherein each memory string includes a plurality of series-connected memory cells arranged between intersecting bit lines and word lines.

Figure (FIG. 7 is a partial schematic view of a typical NAND flash memory. The memory cell array shown in FIG. 7 includes N+1 bit lines (BL0-BLN), n+1 word lines (WL0-WLn), and N+1 memory strings (ST0-STN) connected between a common source line CSL and a corresponding bit line BL. Each memory string ST includes n+1 series-connected nonvolatile memory cells (MC0-MCn). Each nonvolatile memory cell MC is assumed to have a floating gate structure that may be electrically rewritten to a desired data state.

Within this configuration, the drain of each memory cell MCn is connected to a corresponding bit line BL0 through a string select transistor SS1. The source of memory cell MC0 is connected to a common source line CSL through a ground select transistor GS1. Control gates of the memory cells MC in a particular row are commonly connected to a word line WL.

In the memory cell array of FIG. 7, an erase operation is performed by applying a high voltage (e.g., 20V) to a constituent semiconductor substrate while applying 0V to the word lines WL0-WLn. Under these voltage conditions, electrons are removed from a floating gate (i.e., an electrical charge accumulation layer) typically formed of polysilicon. In this manner, the threshold voltage of memory cell MC may be set to an erase threshold voltage VthL (e.g., −1V).

During a write (or programming) operation, electrons are injected onto the floating gate from the semiconductor substrate by applying 0V to the semiconductor substrate while a high voltage (e.g., 20V) is applied to the control gate (selected word line WL). In this manner, the threshold voltage of memory cell MC may be increased from the erase threshold voltage VthL.

Certain data values are ascribed to respective programmed threshold voltage states. In a binary memory cell MC, a data value of "1" may be ascribed to the erase threshold voltage VthL, and a data value of "0" may be ascribed to a higher (programmed) threshold voltage VthH (e.g., 3V).

During a read operation directed to a particular memory cell, after pre-charging all of the bit lines (BL0-BLN) to a predetermined voltage, a read voltage (e.g., 2V) between the higher threshold voltage VthH and the erase threshold voltage VthL is applied to a control gate of selected memory cell through the word line connected to a memory cell MC. A voltage higher than the read voltage is applied to control gates of memory cells MC except the selected memory cell, the string select transistor SS1 and the ground select transistor GS1. The memory cells MC except the selected memory cell, the string select transistor SS1 and the ground select transistor GS1 are turned ON.

When a data value for the selected memory cell is "1", a cell current flows through the corresponding memory cell. When a data value for the selected memory cell is "0", the cell current does not flow. Thus, the written data value for a selected memory cell may be read on the basis of whether or not the cell current flows in response to the read operation voltage conditions.

During a read operation in the memory cell array of NAND flash memory shown in FIG. 7, the voltage of the common source line CSL increases according to the amount of current flowing from each memory string to the common source line CSL. As a result, the threshold voltage of the selected memory cell may unintentionally change. That is, a voltage increase on the common source line CSL may drive the voltage of the common source line CSL above ground voltage due to the voltage drop caused by current flowing to the common source line CSL and a parasitic resistance inherent in the common source line CSL.

For example, in the memory cell array of the NAND type memory cell shown in FIG. 7, it is assumed that a data value of "0" has been written to selected memory cells MCa, MCb and MCc. Then, a verify read operation is performed on the selected memory cells MCa, MCb and MCc. It is further assumed that each of the memory cells MCa, MCb and MCc is insufficiently written, a threshold voltage Vtha of the memory cell MCa is equal to a threshold voltage Vthb of the memory cell MCb and a threshold voltage Vthc of the memory cell MCc is greater than the threshold voltage Vtha and the threshold voltage Vthb (i.e., Vtha=Vthb<Vthc). Finally, it is assumed that each of the threshold voltages Vtha, Vthb and Vthc is less than a verifying read voltage Vvfy which will be described later (i.e., Vtha, Vthb, Vthc<Vvfy).

Under these assumptions, the verifying read voltage Vvfy is applied to a word line WL commonly connected to control gates of the memory cells MCa, MCb and MCc. A read voltage Vread is applied to other word lines WL. Memory cells connected to the word line WL to which the read voltage Vread is applied enter a pass state (i.e., a state wherein current may flow). The string select transistor SS1 and the ground select transistor GS1 are turned ON.

The verifying read voltage Vvfy is applied to the control gates of the memory cells MCa, MCb and MCc. Since the verifying read voltage Vvfy is greater than the threshold voltages Vtha, Vthb and Vthc, the memory cells MCa, MCb and MCc will be turned ON.

However, when the verifying read voltage Vvfy is applied, the memory cells MCa and MCB having the threshold voltages Vtha and Vthb less than the threshold voltage Vthc of the memory cell MCc are turned ON first. A cell current Ia and a cell current Ib flow in the common source line CSL through the memory cells MCa and MCb. At this time, a voltage increase (referred to as "CLS noise") on the common source line CSL having a parasitic resistance occurs.

A voltage VGS between a gate and a source of the memory cell MCc and a voltage VDS between a drain and a source of the memory cell MCc are reduced (i.e., the threshold voltage Vthc becomes relatively high) and thereby a current does not flow through the memory cell MCc. As a result, it becomes difficult if not impossible to correctly determine whether the memory cell MCc is an OFF-cell, despite its (intended) programmed data state of "0".

FIG. 8, inclusive of FIGS. 8A, 8B, and 8C, further illustrates the effect that the voltage increase (i.e., the CSL noise) on the common source line CSL has on the voltage VGS between the gate and source and the voltage VDS between a drain and a source. In a memory cell MC illustrated in FIG. 8A, when CSL noise does not exist in the common source line CSL. Then, as illustrated in FIG. 8B, a pre-charge voltage of 0.6V is applied to the drain of the memory cell MC through a bit line BL. A voltage of 1.0V is applied to the gate of the memory cell MC through a word line WL. A voltage of 0V is applied to the source via the common source line CSL. Under these assumed conditions, a voltage between the drain and source of the memory cell MC is 0.6V (i.e., VDS=0.6V).

When CSL noise of 0.3V occurs in the common source line CSL, as illustrated in FIG. 8C, the source voltage of the memory cell MC increases by 0.3V. Thus, the voltage VGS between the gate and source of the memory cell MC becomes 0.7V. A voltage VDS between the drain and source of the memory cell MC becomes 0.3V. When CSL noise occurs in the common source line CSL, the voltage VGS and the voltage VDS are reduced and thereby the current flowing through the memory cell MC is reduced.

FIG. 9 is a graph further illustrating the change in drain current relative to the voltage VDS between the drain and source of the memory cell described in FIG. 8. A characteristic curve A represents a case of when CSL noise does not exist and a characteristic curve B represents a case of when CSL noise exists. As illustrated in FIG. 9, even though applying a same word line voltage, the voltage VGS between the gate and source of memory cell is reduced due to the CSL noise and thereby a characteristic curve of drain current varies from a characteristic curve A to a characteristic curve B. Thus, a cell current reduced from a drain current of when the CSL noise does not exists (i.e., a drain current corresponding to a point a1 on the characteristic curve A) to a drain current of when the CSL noise exists (i.e., a drain current corresponding to a point b1 on the characteristic curve B).

Even though a similar word line voltage is applied to a memory cell, if the value of the resulting drain current is slightly lower reduced from the current corresponding to the point a1 on the characteristic curve A, the programmed state of the memory cell may be misjudged depending upon whether the CSL noise exists or not. That is, a read operation directed to such a memory cell may fail due to the presence of CSL noise.

As described above, when CSL noise exists, the threshold voltage of a read cell is increased, the degree of accuracy for the read operation and write operation may be deteriorated. According to a conventional response, after pre-charging a plurality of bit lines BL before performing a read operation, a dummy read voltage lower than a predetermined read voltage is applied to the plurality of selected memory cells connected to a selected word line. At this time, current flows through a plurality of memory cells connected to an unselected word line. Charge on the bit line BL connected to a selected memory cell having a threshold voltage sufficiently less than a read voltage are discharged through the selected memory cell and the common source line CSL. Thus, the CSL noise is reduced and thereby unintended variations in threshold voltage may be prevented. That is, according to the conventional remedy to the foregoing problem, read operation accuracy may be improved by performing the read operation only after reducing (or eliminating) an accompanying increase in electric potential from the common source line CSL when the CSL noise exists.

SUMMARY

In one embodiments, the inventive concept provides a semiconductor memory device comprising; a memory cell array including a plurality of memory strings, each memory string including memory cells series-connected between a string select transistor and a ground select transistor, wherein the round select transistor is connected to a common source line (CSL), a plurality of word lines including a selected word line, wherein the selected word line is commonly connected to gates of a row of memory cells extending across the plurality of memory strings, a plurality of bit lines including a selected bit line, wherein each one of the plurality of bit lines is connected to a corresponding one of the plurality of memory strings, a page buffer that provides output data from selected memory cells associated with at least one of the selected word line and the selected bit line during a verify read operation, a fail bit counter that determines a number of fail cells among the selected memory cells, a voltage controller that generates a read voltage applied to the selected word line during the verify read operation and a pre-charge voltage applied to selected bit line during the read verify operation, and a control circuit that controls the voltage controller in response to the number of fail cells.

In another embodiment, the inventive concept provides a method of operating a semiconductor memory device comprises; during a program verification operation, applying a read voltage to a selected word line and applying a pre-charge voltage to a selected bit line, and providing output data in response to the read voltage and pre-charge voltage, determining a number of fail cells in view of the output data, wherein the number of fail cells is directly related to an increase in voltage on a common source line (CSL) connected to memory cells providing the output data, and during a subsequent program verification operation, adjusting at least one of the read voltage and the pre-charge voltage in response to the number of fail cells.

In another embodiment, the inventive concept provides a system comprising; a controller that controls the operation of a semiconductor memory device. The semiconductor memory device comprises; a memory cell array including a plurality of memory strings, each memory string including memory cells series-connected between a string select transistor and a ground select transistor, wherein the round select transistor is connected to a common source line (CSL), a plurality of word lines including a selected word line, wherein the selected word line is commonly connected to gates of a row of memory cells extending across the plurality of memory strings, a plurality of bit lines including a selected bit line, wherein each one of the plurality of bit lines is connected to a corresponding one of the plurality of memory strings, a page buffer that provides output data from selected memory cells associated with at least one of the selected word line and the selected bit line during a verify read operation, a fail bit counter that determines a number of fail cells among the selected memory cells, a voltage controller that generates a read voltage applied to the selected word line during the verify read operation and a pre-charge voltage applied to selected bit line during the read verify operation, and a control circuit that controls the voltage controller in response to the number of fail cells.

BRIEF DESCRIPTION OF THE DRAWINGS

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

FIG. 2 is a graph showing a relationship between the number of ON-cells and a common source line voltage when performing a program verification.

DETAILED DESCRIPTION

Figure 1:
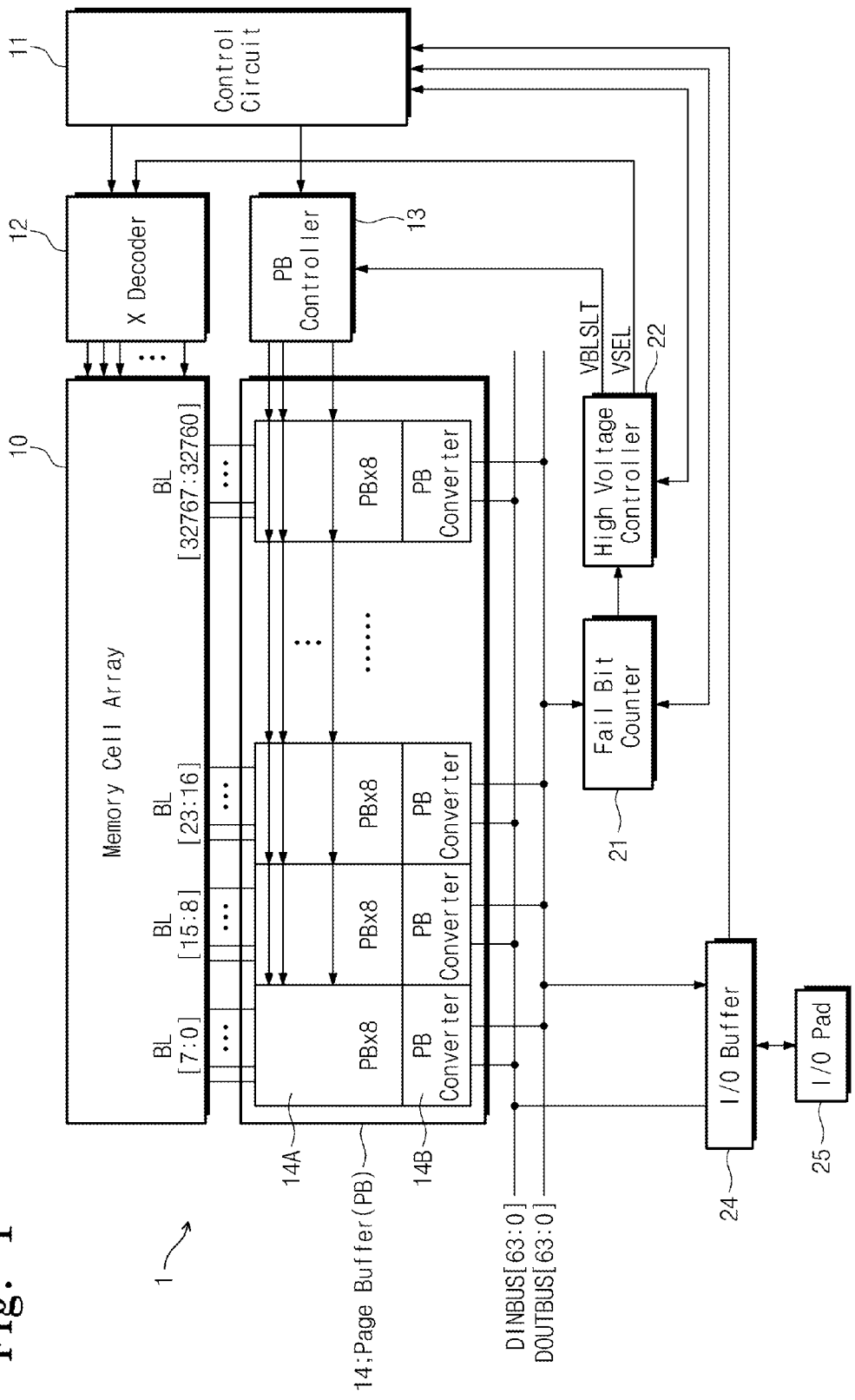
FIG. 1 is a block diagram illustrating a semiconductor memory device in accordance with an embodiment of the inventive concept.

Embodiments of inventive concepts will be described more fully hereinafter with reference to the accompanying drawings. This inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels refer to like or similar elements.

During a write (or program) operation directed to a selected memory cell in a NAND type flash memory device, data is programmed using an incrementally increasing program voltage over a sequence of programming loops, a program verification operation (a "verify read operation") associated with each loop is typically required to carefully control the resulting threshold voltage distribution of the selected memory cell. When performing the verify read operation, current flows through the memory string including the selected memory cell to a connected common source line CSL, and accordingly, common source line noise (CSL noise) may occur. As noted above, the threshold voltage of the memory cell is relatively increased due to the CSL noise, so that the accuracy of the verify read operation is deteriorated. To address this deterioration in accuracy of a "current" verify read operation in a semiconductor memory device of the inventive concept, a number of "fail cells" and "inhibit cells" is counted. Then, during a "next" verify read operation in the ongoing sequence of verify read operations performed during a programing verification operation, a voltage applied to a word line and a pre-charge voltage applied to a bit line may be corrected according to the number of fail cells and inhibit cells.

As is conventionally appreciated, an inhibit cell is a memory cell other than the selected memory cell in the memory string that is not intended to be programmed (i.e., a cell that should maintain its current erase or programmed state). As a result, during a verify read operation, an inhibit cell will pass more current than a properly programmed memory cell.

The term fail cell is used to denote a memory cell that was intended to be programmed during a write operation, but as yet fails to exhibit the intended programming state. As a result, during the verify read operation a fail cell will also pass more current than a properly (non-fail) memory cell.

Hence, semiconductor memory devices in accordance with certain embodiments of the inventive concept count the number of fail cells and inhibit cells during a program verification operation. One or more "correction voltage(s)" may then applied to the word line and/or bit line in accordance with the number of fail cells and inhibited cells. As a result and contrary to the conventional remedy described above, it is not necessary to provide a dummy read period. This allows semiconductor memory devices according to the inventive concept to run at relatively higher speeds with improved data read/write accuracy.

FIG. 1 is a block diagram of a semiconductor memory device in accordance with an embodiment of the inventive concept.

The semiconductor memory device 1 shown in FIG. 1 is assumed to be a NAND type flash memory. The semiconductor memory device 1 generally comprises in relevant portion a memory cell array 10, a control circuit 11, a row (X) decoder 12, a page buffer (PB) controller 13, a page buffer (PB) 14, a fail bit counter 21, a high voltage controller 22, an input/output (I/O) buffer 24 and an input/output (I/O) pad 25.

The control circuit 11 controls the respective and interrelated operations of the row (X) decoder 12, the page buffer (PB) controller 13, the page buffer (PB) 14, the fail bit counter 21 and the high voltage controller 22. The control circuit 11 controls the overall operation of the semiconductor memory device 1 during read, write (program) and erase operations. The controller circuit 11 receives an address signal or a control command signal from the input/output buffer 24. The control circuit 11 receives information indicating the number of fail cells and/or the number of inhibit cells from the fail bit counter 21. A BL correction value for the pre-charge voltage subsequently applied to a bit line BL or a WL correction value for the voltage applied to a word line WL may then be defined by the control circuit on the basis of this information.

The row decoder 12 receives an address signal from the input/output buffer 24 through the control circuit 11. The row decoder 12 decodes the received address signal to select a word line connected to a memory cell in which read, write and erase operations of data will be performed. The row decoder 12 receives a voltage signal VSEL from the high voltage controller 22 to apply a voltage corresponding to read, write and erase operations of data to a word line WL.

The page buffer controller 13 controls an operation of the page buffer 14. The page buffer controller 13 receives a voltage signal VBSLT of bit line BL corresponding to read, write and erase operations of data to output the voltage signal VBSLT to the page buffer 14.

A plurality of memory cell blocks of page unit (e.g., 8 bit unit) is disposed in parallel to constitute the memory cell array 10. For example, 32768 bit lines (BL0-BL327670 may be disposed in the memory cell array 10. The memory cell block of page unit may therefore assume n+1 bit lines, where n=7 like the exemplary NAND type flash memory already described in relation to FIG. 7. That is, the memory cell block of page unit may include, as one working example, 8 memory strings ST0-ST7 respectively associated with 8 bit lines BL0-BL7 and word lines WL0-WLn, as well as a common source line CSL.

Each of the memory strings ST0-ST7 includes a number of series-connected nonvolatile memory cells MC0-MCn having a floating gate structure. The drain of memory cell MCn is connected to a corresponding bit line BL through a first string select transistor SS1. The source of memory cell MC0 is connected to the common source line CSL through a ground select transistor GS1. The common source line CSL is connected to ground through a transistor NT. The transistor NT is turned ON/OFF in accordance with a control signal CR applied to its gate. The transistor NT is turned ON during a verify read operation.

In the memory cell array 10, a bit line BL corresponding to each memory string ST is connected to the page buffer 14 to perform read and write operations on a page unit basis. The page buffer 14 is comprised of a page buffer block (PBX8) 14A and a page buffer converter 14B that are disposed in parallel.

The page buffer block 14A includes a pre-charge circuit receiving a control command and a signal of pre-charge voltage from the page buffer controller 13 to apply a pre-charge voltage to a bit line BL. The page buffer block 14A includes a sense amplifier circuit to read out data written in a memory cell MC. The page buffer block 14A outputs data read from a memory cell MC to the input/output buffer 24 through the buffer converter 14B and an output data bus DOUTBUS[63:0]. The page buffer block 14A performs an operation of writing data in a memory cell MC from the page buffer converter 14B. Read, write and erase operations are performed using the page buffer block 14A, the page buffer converter 14B, the row decoder 12, the page buffer controller 13 and the high voltage controller 22 as controlled by the control circuit 11.

The page buffer converter 14B receives an address signal and a write data signal from the input/output buffer 24 through an input data bus DINBUS[63:0]. The page buffer converter 14B performs the function of a column decoder selecting a designated page buffer block 14A by page unit on the basis of the received address signal. The page buffer converter 14B outputs the write data signal received from the input/output buffer 24 to the page buffer block 14A. The page buffer converter 14B outputs data of memory cell MC read by the page buffer block 14A to the input/output buffer 24.

The fail bit counter 21 counts a number of fail bits respectively indicating a fail cell as the result of a current (i.e., an ongoing) verify read operation. For example, the fail bit counter 21 may count the number of cells becoming an ON cell among the inhibit cells. In turn, the number of inhibit cells may be set in accordance with address data during the write (program) operation. Information regarding the number of inhibit cells may be stored in the control circuit 1 lusing a register or scratch pad memory.

Under these conditions, the fail bit counter 21 may count the number of inhibit cells becoming an ON-cell on the basis of the information numbering the inhibit cells. That is, the fail bit counter 21 may be used to determine a number of inhibit cells becoming an ON-cell and provide this number to the control circuit 11.

The high voltage controller 22 may be used to generate voltage(s) used during the read, write and erase operations. For example, the high voltage controller 22 may be used to generate one or more boosted voltage(s) greater than an externally provided power supply voltage. Such voltages, as provide by the high voltage controller 22, may be provided to the row decoder 12 as a selection signal VSEL and to the buffer controller 13 as a bias signal VBLSLT. The operation of the high voltage controller 22 may be controlled by the control circuit 11.

The input/output buffer 24 is a buffer circuit used when inputting data, an address signal and a control command and outputting data. The input/output buffer 24 is connected to the input/output (I/O) pad 25 that is connection terminal to an external circuit.

As described above, the semiconductor memory device 1 of FIG. 1 according to an embodiment of the inventive concept provides the capability of correcting (or adjusting) the level of a pre-charge voltage applied to a bit line BL and a WL voltage applied to a word line WL in response to detected CSL noise. This provision will be generally referred to as a "correction operation" and will be described in some additional detail hereafter.

A program verification operation may be performed in the semiconductor memory device 1 of FIG. 1 as part of a write (or program) operation. It is common to use an iterative sequence of loops to program data to the semiconductor memory device, wherein each successive programming lop uses an incrementally increased programming voltage. A subsequent verification of programmed bit(s) during each loop is required to control the distribution of the memory cell threshold voltage. Within the context of the inventive concept, when performing a program verification, the WL voltage applied to a word line WL and pre-charge voltage applied to a bit line BL may be corrected using an approach like the one described below.

During a (first) or current program verification operation, the fail counter 21 counts a number of inhibit cells becoming, respectively, an ON-cell as the result of the data being written to the memory cell array 10. The fail counter 21 outputs this "fail-bit information" to the control circuit 11.

The control circuit 11 already knows the number of inhibit cells from the data being written to the memory cell array 10.

Then , during a (second) or next program verification operation, the control circuit 11 may control the operation of the high voltage controller 22 in accordance with the fail bit information and the number of inhibit cells obtained during the first program verification operation. The WL voltage applied to a word line WL may be corrected and applied through the row decoder 12. The pre-charge voltage applied to a bit line BL may be corrected and applied through the page buffer controller 13.

Then, during a (third) next subsequent program verification operation, the control circuit 11 may be similarly used to correct the WL voltage and pre-charge voltage based on an updated number of fail cells obtained during the second program verification operation.

An incremental level ($\Delta V$) for a correction voltage calculated during the first and second program verification operations may be expressed as: ($\Delta V = \Delta VCSL \times$ the number of all ON-cells), wherein the number of all the ON-cells is equal to (the number of fail bits+the number of inhibit cells).

The $\Delta$VCSL is a corresponding voltage increase per ON-cell occurring in a common source line CSL. That is, the increased voltage $\Delta$V with respect to the common source line CSL becomes a correction level for a pre-charge voltage applied to the bit line BL and a read voltage applied to the word line WL.

Although the voltage on the common source line CSL is increased by the CSL noise, the control circuit 11 may correct the read voltage applied to the word line WL and the pre-charge voltage applied to the bit line BL with respect to this increased voltage. That is, a gate-source voltage VGS and a drain-source voltage VDS may be corrected according to the voltage increase caused by the CSL noise. Thus, the conventional relative migration in the threshold voltage of memory cell MC may be prevented. As a result, during a program verification operation, a distribution due to the difference between a threshold voltage Vth of memory cell MC passed during a first verification operation and a threshold voltage Vth of memory cell MC passed during a last verification operation may be reduced and thereby the degree of accuracy associated with the write operation may be improved.

FIG. 2, including FIGS. 2A and 2B, further illustrates a relationship between a number of ON-cells and a common source line voltage with respect to a number of verification operations assuming the use of an incremental step pulse-program (ISPP) method. In FIG. 2, the horizontal axis represents the number of verification operations and the vertical axis represents the number of ON-cells and a common source line voltage (a source voltage VCSL of memory cell).

As is conventionally understood, the ISPP is a method for performing a write operation using a stepped voltage applied to the gate of a selected memory cell. The ISPP is a method of writing data in the selected memory cell using a repeated loop approach that includes: applying a write voltage to the gate of the selected memory cell; performing a verification operation; increasing the write voltage; and then applying the increased write voltage to the gate of the selected memory cell until it has been properly programmed.

Writing data in a memory cell means that a high voltage (e.g., 20V) is applied to a control gate (selected word line WL) to inject electrons into a floating gate and thereby a threshold voltage is increased.

In FIG. 2A, the number (n1) of ON-cells is the sum of the number of fail cells (cells maintaining an "ON" state) when the first program verification operation is performed and the number of inhibit cells. The number (n2) of ON-cells represents the number of inhibit cells when a program verification operation is finished. A voltage VCSL1 represents an increase in voltage of the common source line CSL generated by currents flowing through fail cells and inhibit cells when the first program verification operation is performed. A voltage VCSL2 represents a voltage of the common source line CSL generated by currents flowing through inhibit cells when a program verification operation is finished.

As illustrated in FIG. 2A, when the first pass is performed, there are too many fail cells. Thus, the sum of fail bits and inhibit cells becomes n1. A voltage of the common source line CSL increases to VCSL1 by currents flowing from a bit line BL to the common source line CSL through the fail cells and the inhibit cells. Here, the voltage VCSL1 becomes a correction level $\Delta$V, when a next program verification operation is performed, a voltage applied to a word line WL and a pre-charge voltage applied to a bit line BL are corrected based on the correction level $\Delta$V.

As illustrated in FIG. 2B, assume that a source voltage 0.0V, a gate voltage 1.0V and a drain voltage 0.6V are applied to respective terminals of memory cell MC. If a common source line voltage VCSL is increased by 0.3V by a CSL noise, then 0.3V becomes an appropriate correction level $\Delta$V.

A read voltage applied to a word line WL and a pre-charge voltage applied to a bit line BL are corrected based on the correction level $\Delta$V. As a result, the source voltage becomes 0.3V, the gate voltage becomes 1.3V and the drain voltage becomes 0.9V. That is, when a next verify read operation is performed, the correction level $\Delta$V is added to the various bias voltages applied to the gate voltage and drain voltage is applied to a word line WL and a bit line.

As illustrated in FIG. 2A, as the number of program verification operations increases, the number of memory cells becoming fail bit (fail cells) decreases. Thus, the common source line voltage VCSL may be gradually reduced.

When a program verification operation is finished, that is, when all bits are passed, the common source line voltage VCSL becomes VCSL2 by currents flowing through inhibit cells and thereby a correction level $\Delta$V becomes VCSL2.

Figure 3:
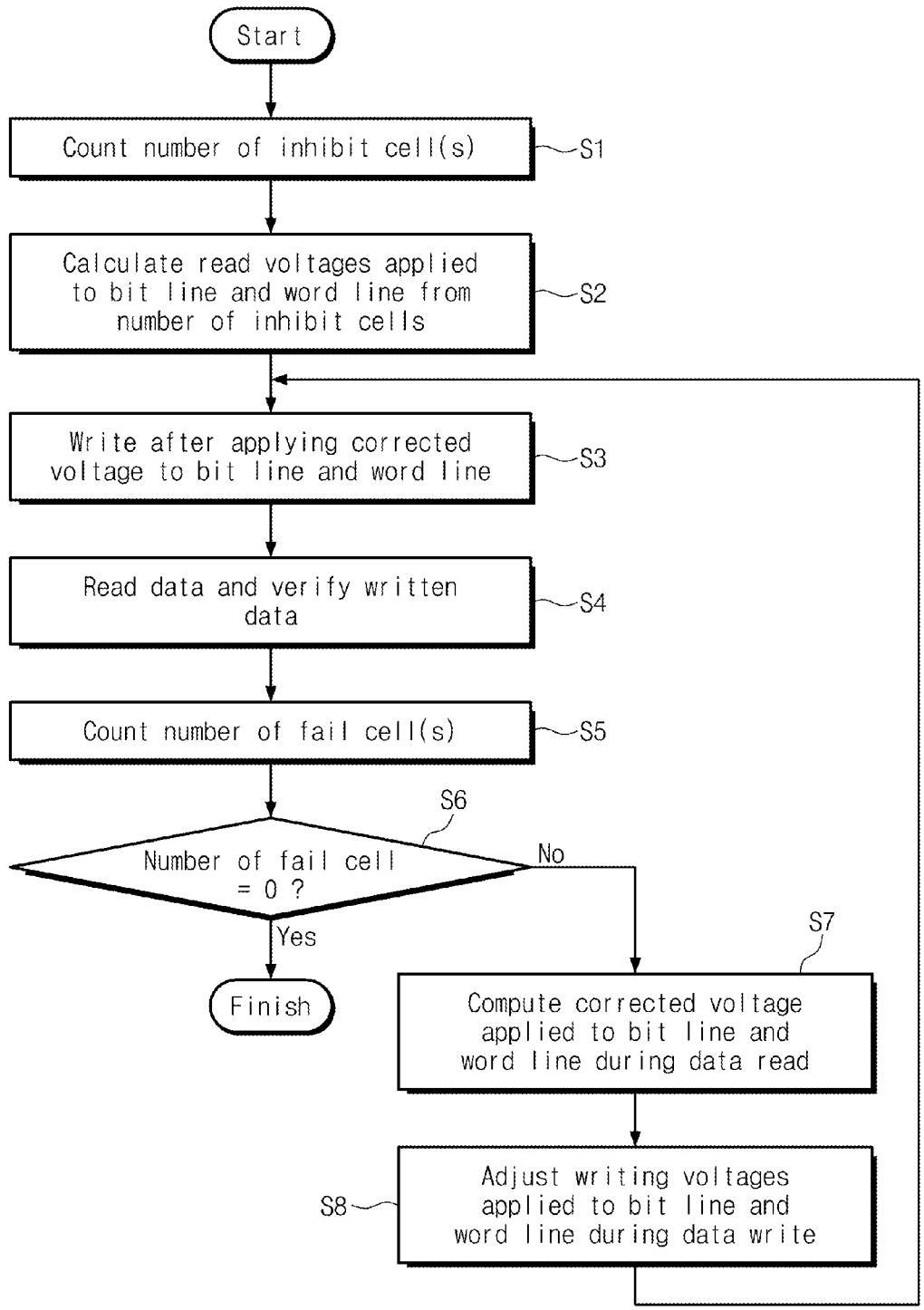
FIG. 3 is a flow chart summarizing a correction method for a word line voltage and a bit line pre-charge voltage.

FIG. 3 is a flow chart summarizing a method of correcting a read word line voltage and a bit line pre-charge voltage used during a program verification operation according to an embodiment of the inventive concept. The program verification operation may be controlled by the control circuit 11 of FIG. 1.

When starting a program verification operation, the control circuit 11 counts the number of inhibit cells becoming an ON-cell by the fail bit counter 21 (S1). The number of inhibit cells may be calculated in advance on the basis of information about inhibit cells kept in the control circuit 11. The control circuit 11 calculates a correction level $\Delta$V from the number of inhibit cells. A correction voltage that the correction level $\Delta$V is added to a verifying read voltage applied to a bit line BL and a word line WL is calculated (S2).

The control circuit 11 controls the high voltage controller 22, a row decoder 12 and the page buffer controller 13. Data is written in a memory cell MC by applying a voltage to a word line WL and a bit line BL (S3). Here, a write operation is performed to condition a threshold voltage of the selected memory cell MC.

After writing data in a memory cell MC, the page buffer 14 reads data from the selected memory cell MC. The fail bit counter 21 compares and verifies data read from the selected memory cell MC which becomes a target of write operation and data which is written (S4). The fail bit counter 21 detects memory cells (fail cells) in which data are not identical to each other to count the number of fail cells (S5). Information about the number of fail cells counted by the fail bit counter 21 is output to the control circuit 11.

The control circuit 11 determines whether the number of fail cells is 0 or not on the basis of the information about the number of fail cells received from the fail bit counter 21 (S6). If no fail cells exist, it is considered that data are normally written in all the memory cells MC. Thus, a program verification operation is finished.

However, if a fail cells exists, a correction level $\Delta$V is calculated based on the number of fail cells and inhibit cells counted by the fail bit counter 21. A correction voltage that the calculated correction level $\Delta$V is added to a verifying read voltage is calculated (S7). The correction voltage calculated in the S7 is used to verify data in the S4.

In the control circuit 11, a write voltage applied to a bit line BL and a word line WL are adjusted (S8) and the correction method goes back to the S3. In the S3, the voltage adjusted in S8 is applied to a bit line BL and a word line WL and then data is written in a memory cell MC.

According to this correction method, when a verify read operation is performed, a voltage applied to a bit line BL and/or a voltage applied to a word line WL may be corrected based on the number of fail cells and inhibit cells. Thus, when a verify read operation is performed on a memory cell MC, it is less affected by a CSL noise generated in a common source line CSL. The overall time required in a program verification operation may be reduced while maintaining a high degree of accuracy in reading data from memory cell. The degree of accuracy of writing data may be improved by improving the degree of accuracy of verify read operation.

In certain embodiments of the inventive concept such as those described above, the correction of both a voltage applied to a word line WL and a pre-charge voltage applied to a bit line BL may be accomplished. However, the present inventive concept is not limited to only this particular approach. For example, only the pre-charge voltage applied to a bit line BL may be corrected according to the number of fail cells and inhibit cells. Similarly, only a read voltage applied to a word line WL may be corrected according to the number of fail cells and inhibit cells.

In another embodiment of the inventive concept, it is further assumed that the level of CSL noise is not uniform over an entire memory cell array 10. For example, a plurality of common source lines CSL may be established in the memory cell array 10 and the memory cell array may be divided into a plurality of areas associated with different common source lines. In this case, it is necessary to correct a verifying read voltage by counting the number of fail cells and inhibit cells in every area.

However, since a voltage applied to a word line WL is common in each area, a voltage applied to a word line WL in each area cannot be corrected. Thus, an effect by a CSL noise is reduced by correcting a pre-charge voltage of bit line BL.

Figure 4:
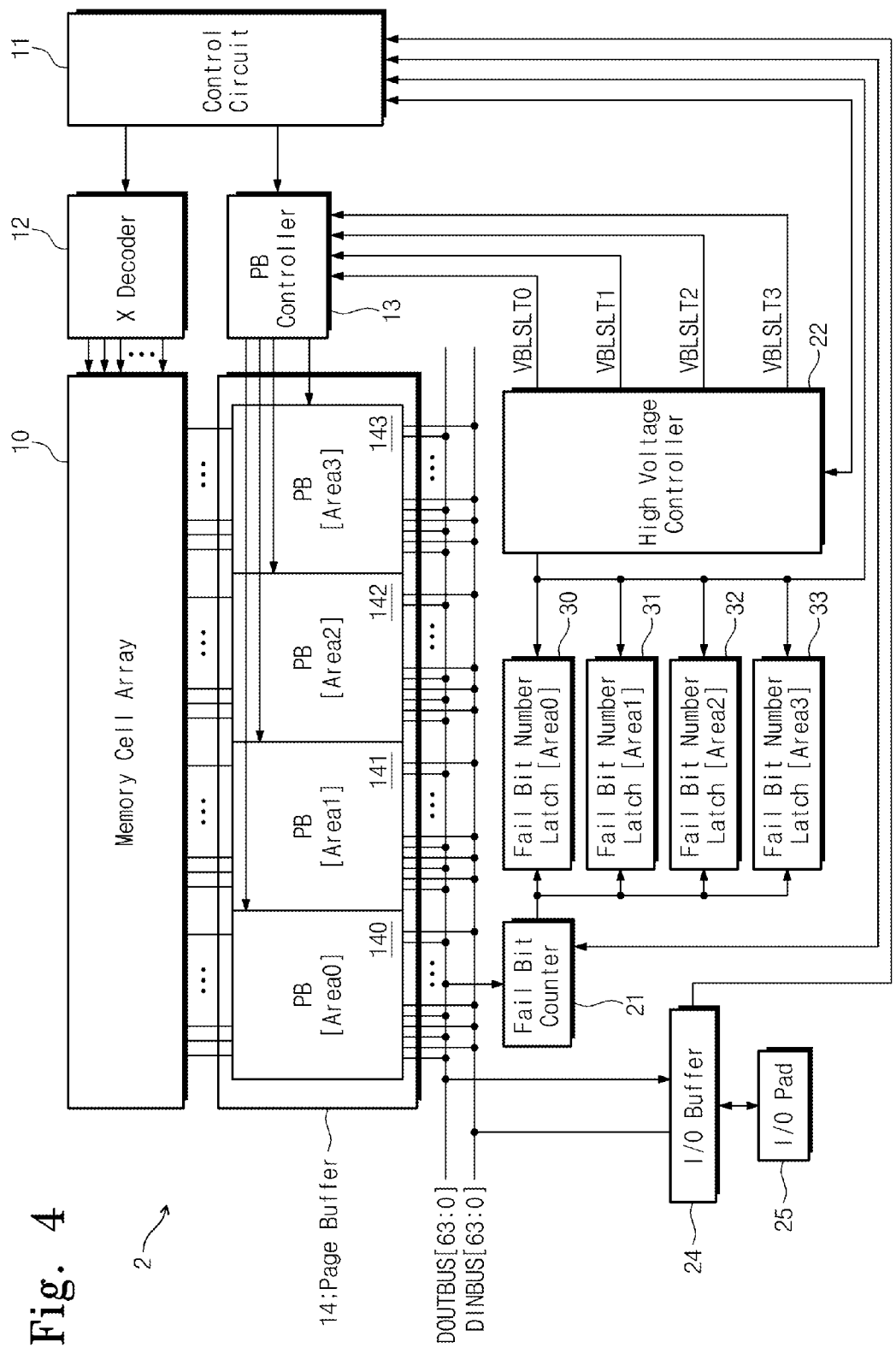
FIG. 4 is a block diagram illustrating another semiconductor memory device in accordance with an embodiment of the inventive concept.

FIG. 4 is a block diagram illustrating another semiconductor memory device in accordance with an embodiment of the inventive concept.

A semiconductor memory device 2 illustrated in FIG. 4 has the same constitution as the semiconductor memory device 1 illustrated in FIG. 1 except that the page buffer 14 is divided into four areas and fail bit number latches 30-33 are added. Thus, like reference numbers refer to like elements throughout and the description of common features already discussed will be omitted for brevity.

In FIG. 4, the memory cell array 10 is divided into a plurality of areas (four areas in the present embodiment). The page buffer 14 is divided into a page buffer area (Area 0)140 corresponding to an area 0, a page buffer area (Area 1) 141 corresponding to an area 1, a page buffer area (Area 2) 142 corresponding to an area 2 and a page buffer area (Area 3) 143 corresponding to an area 3. The fail bit counter 21 counts the number of fail bits and inhibit cells at each area. The fail bit counter 21 stores a count result of area 0 in the fail bit number latch 30, a count result of area 1 in the fail bit number latch 31, a count result of area 2 in the fail bit number latch 32 and a count result of area 3 in the fail bit number latch 33. Information about the count number in the fail bit number latches 30-33 is output to the control circuit 11.

In the semiconductor memory device 2 of FIG. 4, a pre-charge voltage of bit line BL is corrected according to a sequence below.

During a first program verification operation, the fail bit counter 21 calculates the number of ON-cells and inhibit cells in the areas 0-3 from data written in the memory cell array 10. The fail bit counter 21 stores the number of inhibit cells in the area 0 in the fail bit number latch 30, the number of inhibit cells in the area 1 in the fail bit number latch 31, the number of inhibit cells in the area 2 in the fail bit number latch 32 and the number of inhibit cells in the area 3 in the fail bit number latch 33.

Information about the number of inhibit cells in the fail bit number latches 30-33 is output to the control circuit 11. The number of fail bits may be calculated in the control circuit 11.

During a second program verification operation, the control circuit 11, according to the number of inhibit cells counted in the areas 0-3, corrects a pre-charge voltage applied to a bit line BL by the page buffer controller 13 using a correction level ΔV as calculated above.

During a third program verification operation, when performing a program verification operation after the next time, a correction level ΔV is calculated from the number of inhibit cells in the areas 0-3 and cells failed in a program verification operation. Thus, a pre-charge voltage applied to a bit line BL is corrected in every area 0-3.

Figure 5:
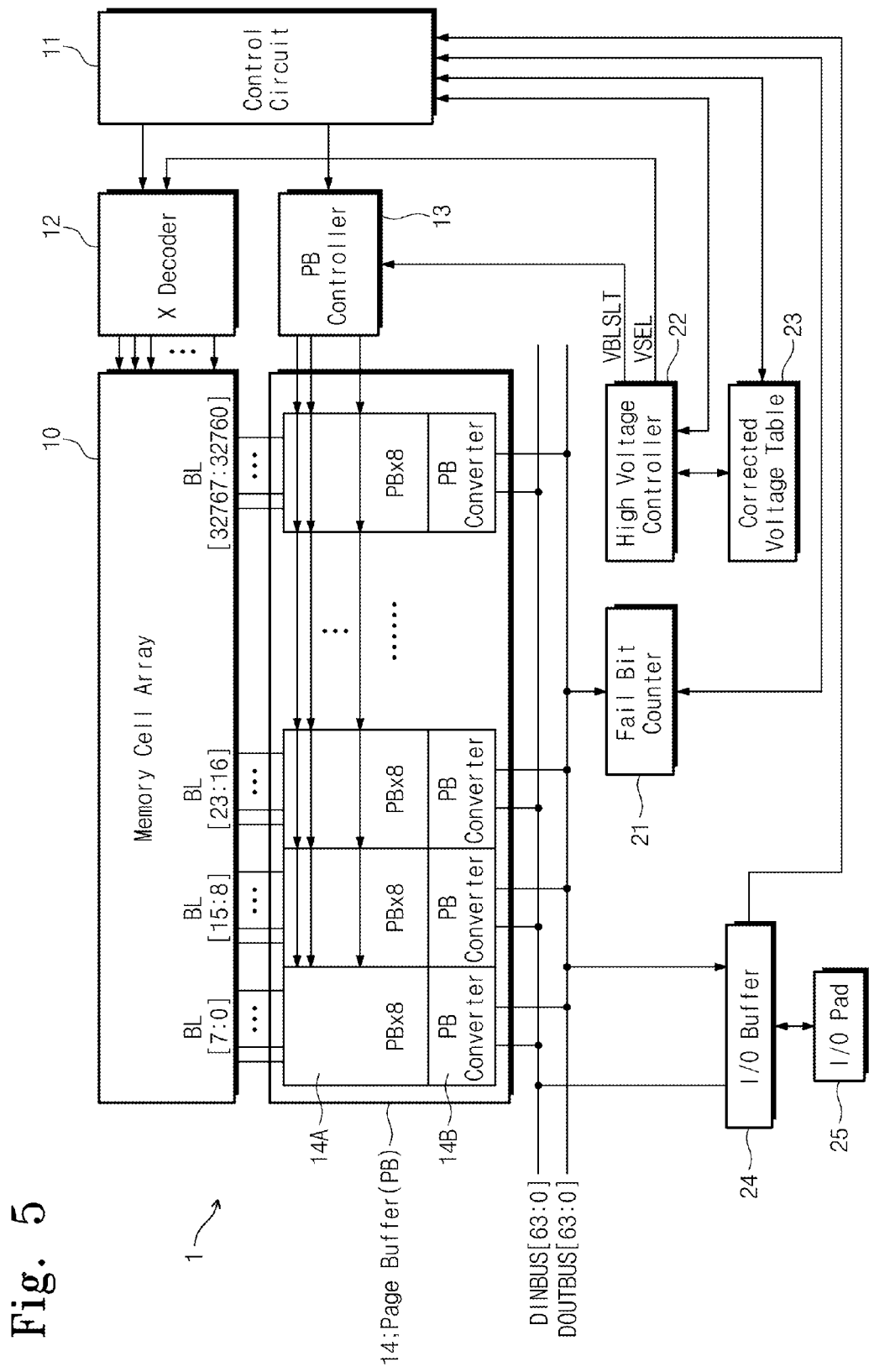
FIG. 5 is a block diagram illustrating yet another semiconductor memory device in accordance with an embodiment of the inventive concept.

FIG. 5 is a block diagram illustrating a yet another semiconductor memory device in accordance with an embodiment of the inventive concept.

A semiconductor memory device 1 illustrated in FIG. 5 has the same constitution as the semiconductor memory device 1 illustrated in FIG. 1 except that a correction voltage table 23 is added. Thus, like reference number refer to like elements throughout and the description of common features already discussed will be omitted for brevity.

A correction voltage of a bit line BL and a word line WL corresponding to an increased voltage (the counted number of fail cells and inhibit cells) of common source line CSL calculated in the inhibit cells and fail cells is stored in the correction voltage table 23. In the embodiment of FIG. 5, a correction value for an increased voltage of the common source line CSL is not calculated using a preset approach like the one described above. Rather, a voltage correction value corresponding to the increased voltage of the common source line CSL may be read from the correction voltage table 23 and a read verification operation performed by a voltage corrected using the read voltage correction value.

If the control circuit 11 receives information about the number of ON-cells (the number of fail-cells and inhibit cells) from the fail bit counter 21, the control circuit 11 reads a voltage correction value corresponding to the ON-cells from the correction voltage table 23 on the basis of the information about the number of ON-cells. The high voltage controller 22, the row decoder 12 and the page buffer controller 13 are controlled based on the read voltage correction value to correct a pre-charge voltage applied to a bit line BL and a voltage applied to a word line WL.

A pre-charge of bit line is done by a voltage which is the sum of a voltage correction value for a bit line BL read from the correction voltage table 23 and a pre-charge voltage of when a verify read operation is performed. A voltage which is the sum of a voltage correction value for a word line WL read from the correction voltage table 23 and a read voltage of when a verify read operation is performed is applied to a word line WL.

Figure 6:
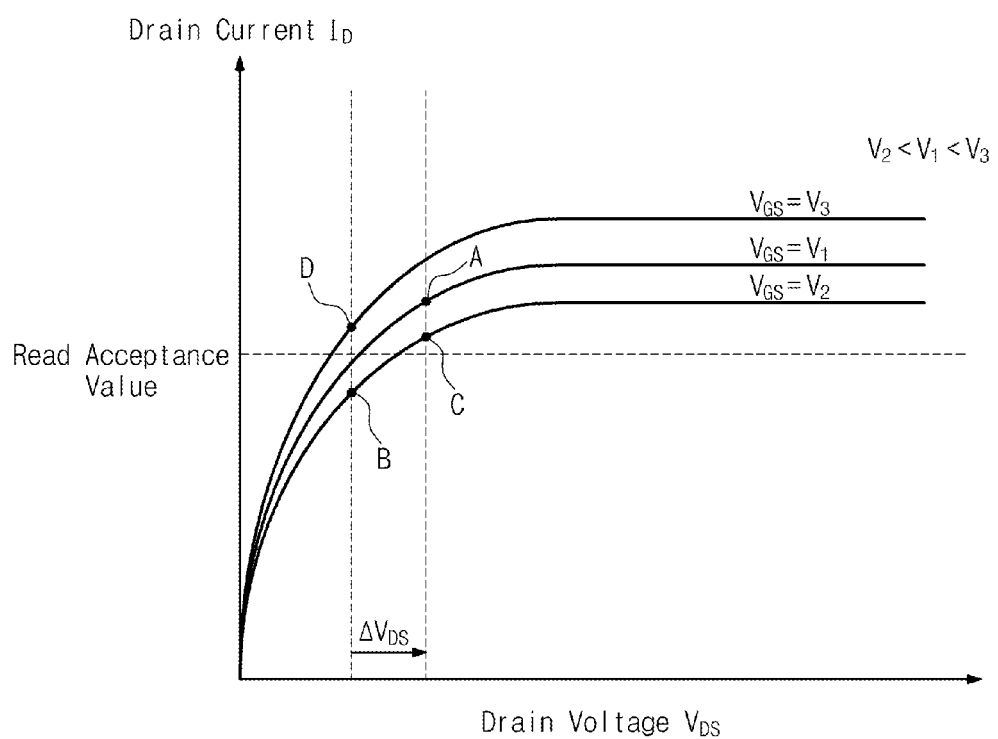
FIG. 6 is a graph describing a correction voltage approach using a correction voltage table.

FIG. 6 is a graph further describing a voltage correction value derivation approach using the correction voltage table 23 of FIG. 5.

In FIG. 6, the horizontal axis represents a drain voltage VDS and the vertical axis represents a drain current ID. Also, the graph illustrates a relationship between the drain voltage VDS and drain current ID when a gate-source voltage VGS is V1, V2 and V3.

In FIG. 6, when the gate-source voltage VGS is V1, a point A represents a drain current ID of when applying a verifying read voltage when a voltage increase does not occur. A point B represents a drain current ID of when applying a verifying read voltage when a voltage increase occurs.

A voltage correction value ΔVDS corresponding to a drain voltage VDS is stored in the correction voltage table 23 so that whenever a voltage is increased due to a CLS noise, a drain current value (point C) greater than a read acceptance value is obtained like when a voltage increase in the common source line CSL does not occur.

A voltage correction value Δ(VGS=V3-V2) corresponding to a gate-source voltage VGS indicated by the correction voltage table 23 so that whenever a voltage is increased due to a CLS noise, a drain current value (point D) greater than a read acceptance value is obtained like when a voltage increase in the common source line CSL does not occur.

By using the correction voltage table 23, a correction voltage corresponding to an increased voltage of common source line CSL is read from the correction voltage table 23 and a write verification operation may be performed using the correction voltage. Thus, a correction voltage corresponding to an increased voltage of common source line CSL (that is, a voltage applied to a bit line BL and a word line WL) may be easily and rapidly set.

A voltage correction value contained in the correction voltage table 23 is a predetermined value based on a relationship of a drain current ID relative to a drain voltage VDS and a gate-source voltage VGS of memory cell calculated in a simulation or an actual measurement value.

The semiconductor memory device according to embodiments of the inventive concept corresponds to the semiconductor memory device of the embodiment described in relation to FIG. 1. The memory cells of the inventive concept correspond to the memory cells MC0-MCn (hereinafter memory cell MC) illustrated in FIG. 7 and the memory strings of the inventive concept correspond to the memory strings ST0-STN (hereinafter memory string ST). The bit lines of the inventive concept correspond to the bit lines BL0-BLN (hereinafter bit line BL), the word lines of the inventive concept correspond to the word lines WL0-WLn (hereinafter word line WL) and the common source line of the inventive concept corresponds to the common source line CSL.

Figure 7:
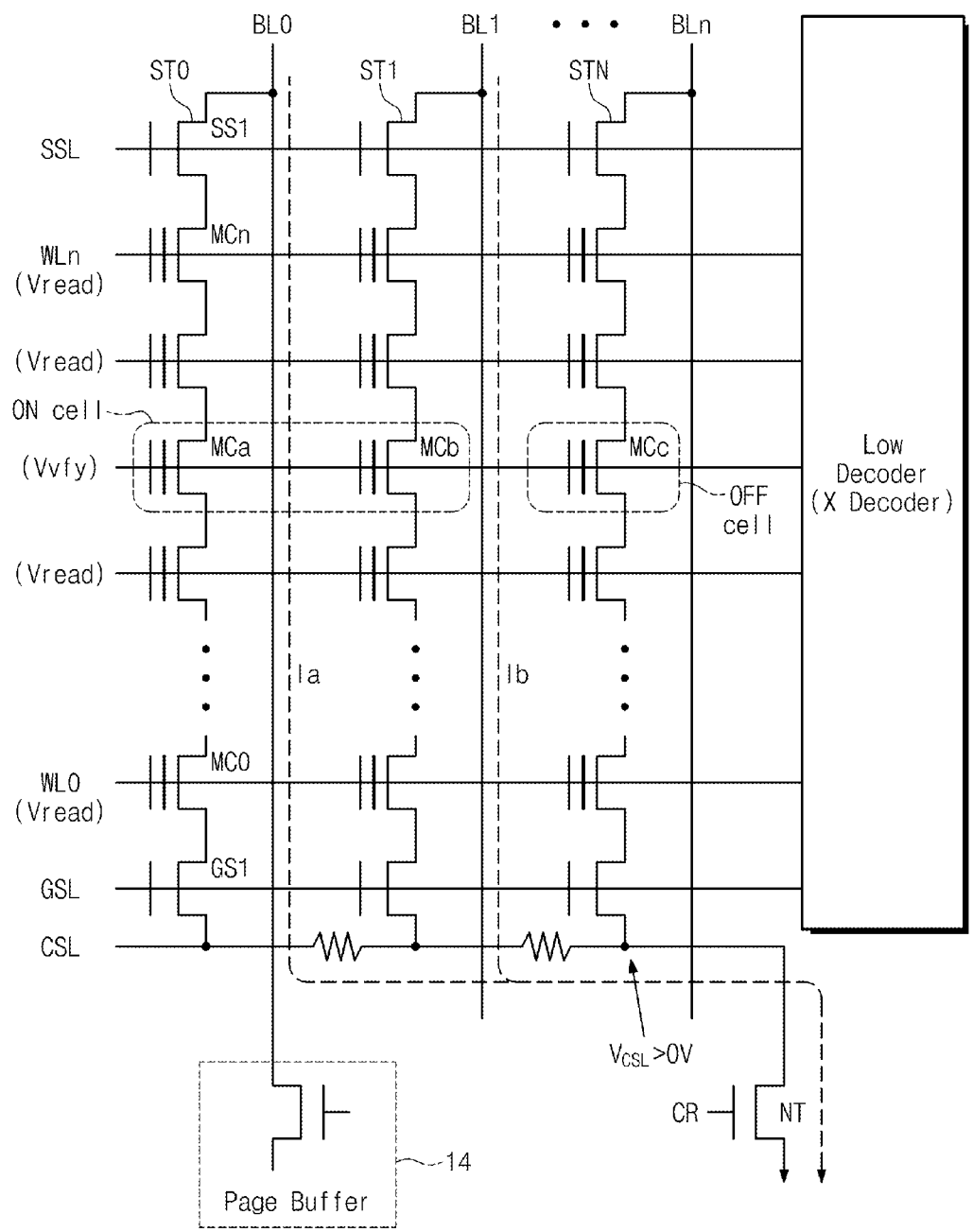
FIG. 7 is a drawing illustrating a memory cell array comprised of NAND type flash memories.
Figure 8:
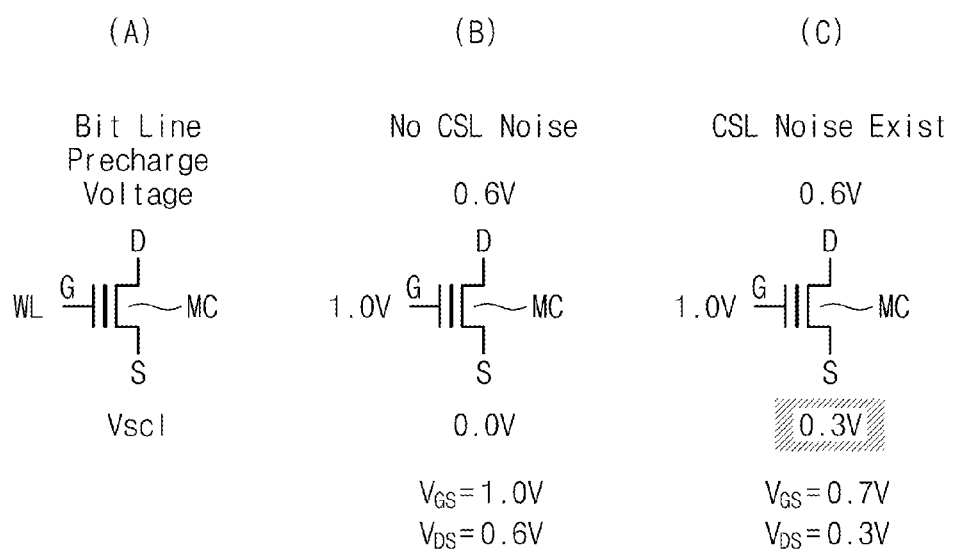
FIG. 8 is a drawing illustrating an effect of a CSL noise on a voltage VGS between a gate and a source and a voltage VDS between a drain and a source.
Figure 9:
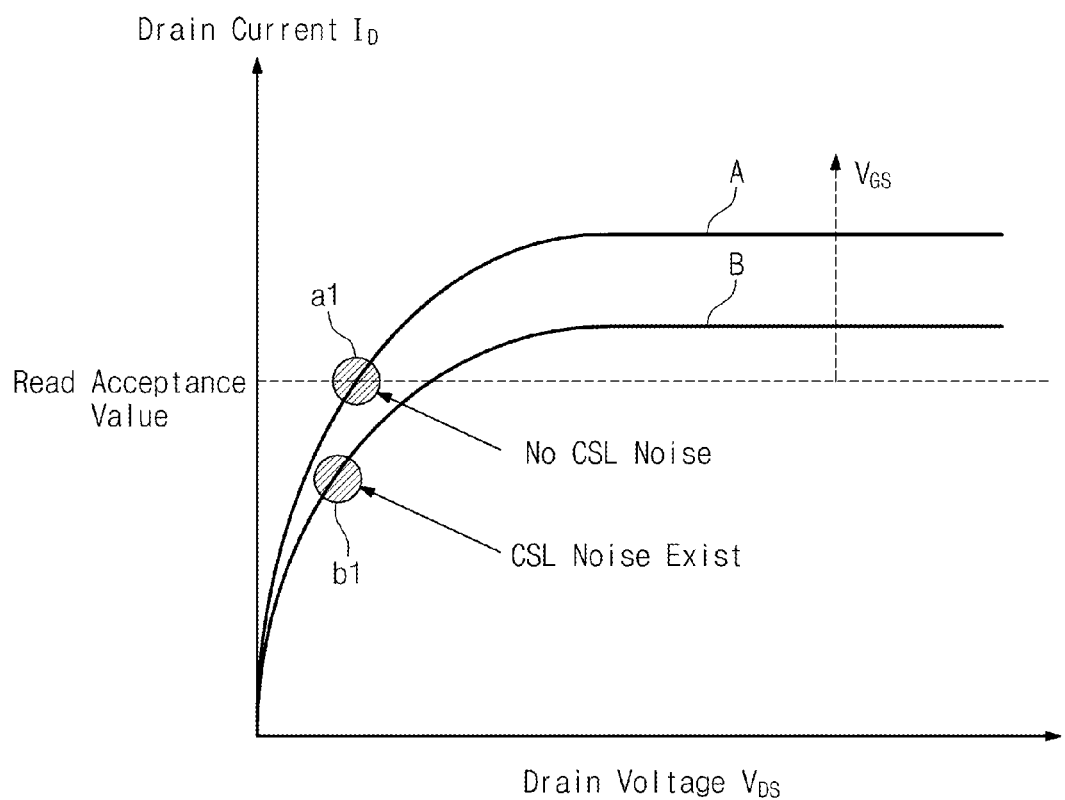
FIG. 9 is a graph showing a change of drain current by a CSL noise.

The string select transistor of the inventive concept corresponds to the string select transistor SS1 illustrated in FIG. 7 and the ground select transistor of the inventive concept corresponds to the ground select transistor GS1. The control circuit of the inventive concept corresponds to the control circuit 11. The control circuit 11 controls operations of the row decoder 12, the page buffer controller 13, the page buffer 14, the fail bit counter 21 and the high voltage controller 22 and controls the whole operation of the semiconductor memory device 1 when reading and erasing data from a memory cell MC and writing data in a memory cell MC.

In the semiconductor memory device 1, the memory strings ST in which memory cells MC are serially connected to each other are disposed in parallel, one end of each of the memory strings ST is connected to a corresponding bit line BL through the string select transistor SS1 and control gates of memory cells MC on a same row are connected to a common word line WL. The semiconductor memory device 1 includes the control circuit 11 correcting a voltage pre-charging a bit line BL according to a voltage increase of common source line CSL caused by a current flowing from the memory string ST to the common source line CSL when reading data from a memory cell MC by pre-charging a bit line BL and then applying a predetermined read voltage to a word line WL.

In the semiconductor memory device 1, the control circuit 11 corrects a voltage pre-charging a bit line BL according to a voltage (CSL noise) of common source line CSL increased by a current flowing from the memory string ST to the common source line CSL.

As a result, when reading data from a memory cell MC, an effect (a problem that a threshold voltage Vth becomes high in appearance) by a voltage increase occurring in a common source line CSL is reduced and thereby a memory cell MC in which a data write operation is not finished is properly detected. When reading data from a memory cell MC, a time required to perform a program verification repeating a read operation and a write operation may be shortened by correcting a voltage pre-charged in a bit line BL while maintaining the degree of accuracy of reading data without preparing the aforementioned dummy read period.

The control circuit 11 corrects a read voltage of the word line WL with respect to a common source line voltage increased by a current flowing through the common source line CSL.

In the semiconductor memory device 1, a voltage (a read voltage of selected cell) applied to a word line WL is corrected according to a voltage increase (CSL noise) of the common source line CSL caused by a current flowing from a memory string ST to the common source line CSL. As a voltage applied to a word line WL is corrected, a voltage pre-charged in a bit line BL may be corrected according to a voltage increase (CSL noise) of the common source line CSL.

Thus, when reading data from a memory cell MC, an effect an effect (a problem that a threshold voltage Vth becomes high in appearance) by a voltage increase occurring in a common source line CSL may be reduced. A memory cell MC in which a data write operation is not finished can be properly detected. When reading data from a memory cell MC, a time required to perform a program verification repeating a read operation and a write operation may be shortened by correcting a voltage applied to a word line WL while maintaining the degree of accuracy of reading data without preparing the aforementioned dummy read period.

The correction voltage table 23 may be prepared that contains a correction value for read voltage of the word line WL corresponding to a voltage increase of the common source line CSL. The control circuit 11 reads a correction value from the correction voltage table 23 and corrects the read voltage using the read correction value to apply the corrected read voltage to the word line WL.

A voltage of word line WL corresponding to an increased voltage of the common source line CSL may be easily and rapidly set.

As described above, in a semiconductor memory device consistent with an embodiment of inventive concept, a dummy read period used in a conventional nonvolatile semiconductor memory device is not required and when performing a program verification operation, a speed of reading data of memory cell and the degree of accuracy of reading data of memory cell may be improved.

The semiconductor memory device 1 in accordance with some embodiments of the inventive concept may be applied to various products. A host 1100 may be constituted by a computer, a digital camera, a cell phone, a MP3 player, a PMP, a game machine and so on. A flash storage device 1200 may be constituted by a solid state drive SSD, a flash memory card or a flash memory module based on a flash memory. The host 1100 and the flash storage device 1200 may be connected to each other through a standardized interface such as ATA, SATA, PATA, USB, SCSI, ESDI, PCI express or IDE interface.

Figure 10:
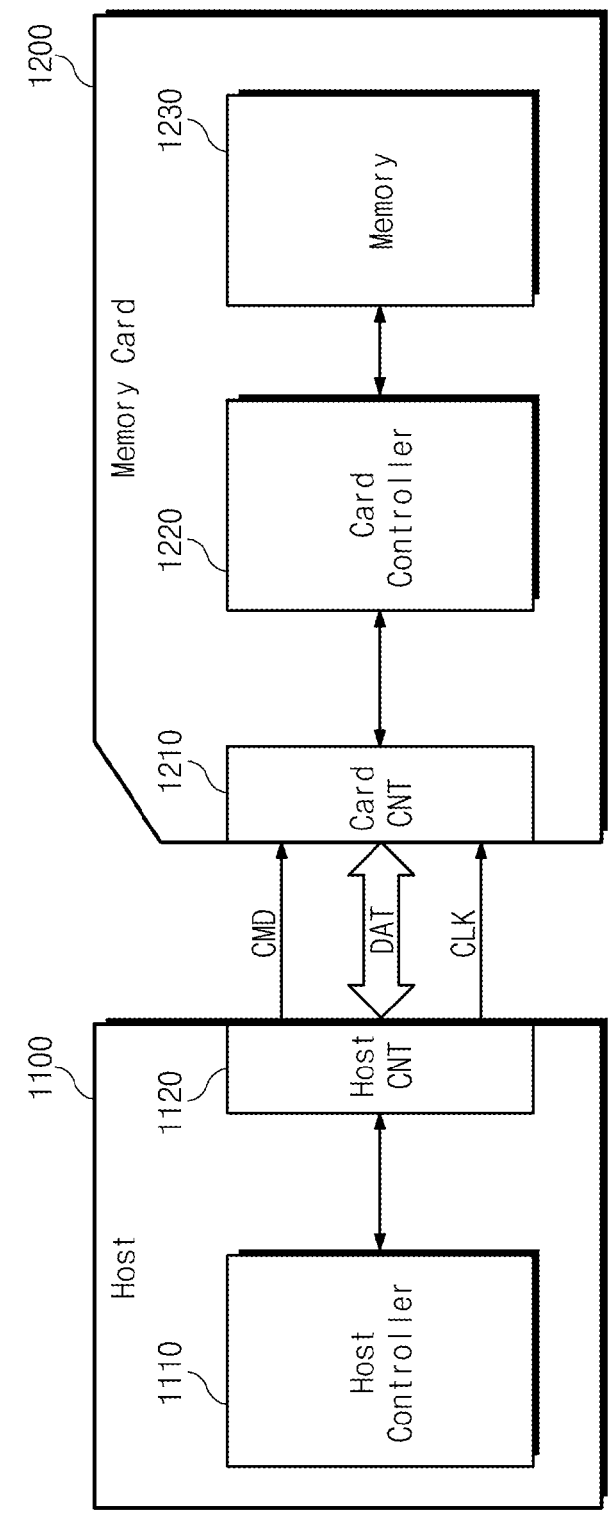
FIG. 10 is a drawing illustrating an example of applying a flash memory system in accordance with some embodiments of the inventive concept to a memory card.

FIG. 10 is a drawing illustrating an example of applying a flash memory system 1000 in accordance with some embodiments of the inventive concept to a memory card. The memory card system 1000 includes a host 1100 and a memory card 1200. The host 1100 includes a host controller 1110 and a host connection unit 1120. The memory card 1200 includes a card connection unit 1210, a card controller 1220 and a flash memory 1230.

The host connection unit 1120 and the card connection unit 1210 include a plurality of pins. Those pins include a command pin, a clock pin and a power supply pin. The number of pins may be different depending on the type of memory card 1200. For example, a SD card has 9 pins.

The host 1100 writes data in the memory card 1200 or reads data stored in the memory card 1200. The host controller 1110 transfers a command (e.g., a write command), a clock signal CLK generated from a clock generator (not shown) in the host 1100 and data DATA to the memory card 1200 through the host connection unit 1120.

The card controller 1220 stores data in the memory 1230 in synchronized with a clock signal generated from a clock generator (not shown) in the card controller 1220 in response to a write command received through the card connection unit 1210. The memory 1230 stores data transferred from the host 1100. For example, if the host 1100 is a digital camera, the memory 1230 stores image data.

In FIG. 10, the card controller 1220 may correct a voltage applied to a bit line and a word line by counting the number of inhibit cells and fail cells when performing a verify read operation of data. That is, the memory card system illustrated in FIG. 10 may support the voltage correction operation described above.

Figure 11:
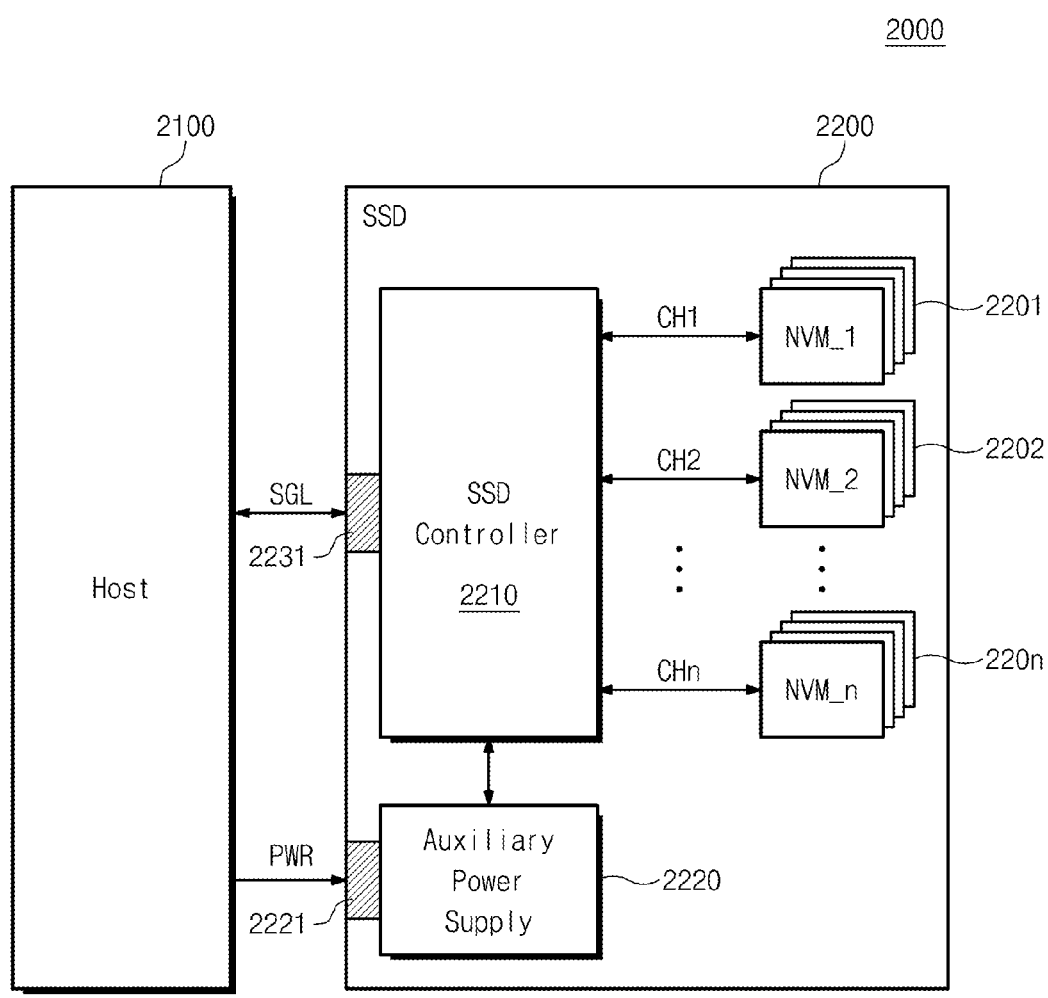
FIG. 11 is a drawing illustrating an example of applying a voltage correction operation in accordance with some embodiments of the inventive concept to solid state drive (SSD).

FIG. 11 is a drawing illustrating an example of applying a voltage correction operation in accordance with some embodiments of the inventive concept to solid state drive (SSD). Referring to FIG. 11, the SSD system 2000 includes a host 2100 and a SSD 2200. The SSD 2200 exchanges a signal with the host 2100 through a signal connector 2231 and receives a power through a power connector 2221. The SSD 2200 includes a plurality of nonvolatile memory devices 2201-220n, a SSD controller 2210 and an auxiliary power supply 2220.

The plurality of nonvolatile memory devices 2201-220n is used as a storage unit of the SSD 2200. The plurality of nonvolatile memory devices 2201-220n may be embodied by a flash memory device having a mass storage capacity. The SSD 220 mainly uses a flash memory.

The plurality of nonvolatile memory devices 2201-220n may be connected to the SSD controller 2210 through a plurality of channels CH1-CHn. One or more memory devices may be connected to one channel. Memory devices connected to one channel may be connected to a same data bus. A flash defragmentation is performed in a type of super block bringing a plurality of memory blocks together or in a type of super page bringing a plurality of pages together.

The SSD controller 2210 exchanges signal SGL with the host 2100 through the signal connector 2231. The signal SGL may include a command, an address and data. The SSD controller 2210 writes data in a corresponding memory device or reads data from a corresponding memory device according to a command of the host 2100.

The auxiliary power supply 2220 is connected to the host 2100 through the power connector 2221. The auxiliary power supply 2220 may receive a power from the host 2100 to be charged. The auxiliary power supply 2220 may be located inside the SSD 2200 or outside the SSD 2200. For example, the auxiliary power supply 2220 may be located at a main board and may provide an auxiliary power to the SSD 2200.

Figure 12:
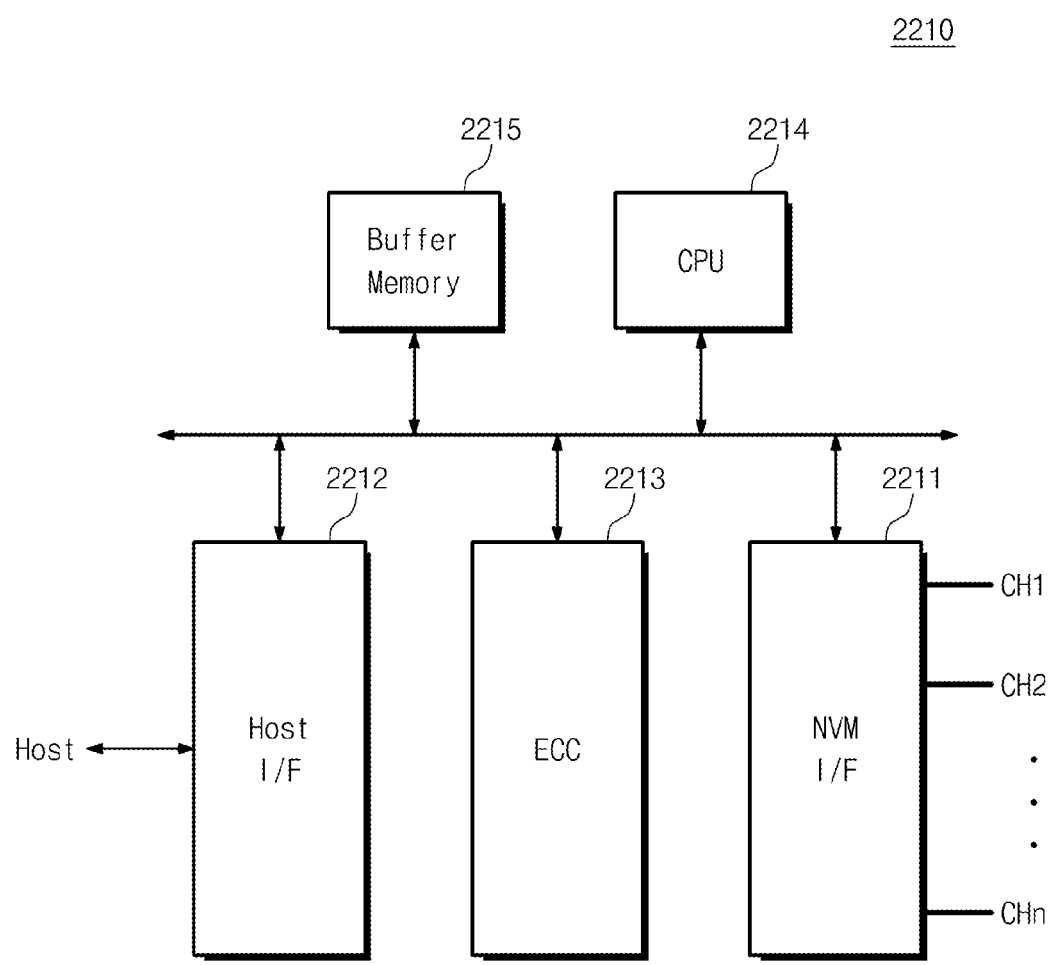
FIG. 12 is a block diagram illustrating a constitution of the SSD controller illustrated in FIG. 11.

FIG. 12 is a block diagram illustrating a constitution of the SSD controller illustrated in FIG. 11. Referring to FIG. 12, the SSD controller 2210 includes a NVM interface 2211, a host interface 2212, an ECC 2213, a central processing unit (CPU) 2214 and a buffer memory 2215.

The NVM interface 2211 scatters data transferred from the buffer memory 2215 to each of channels CH1-CHn. The NVM interface 2211 transfers data read from the nonvolatile memory devices 2201-220n to the buffer memory 2215. The NVM interface 2211 may use an interface method of NAND flash memory. That is, the SSD controller 2210 may perform a program, read or erase operation according to the interface method of NAND flash memory.

The host interface 2212 may interface with the SSD 2200 according to a protocol of the host 2100. The host interface 2212 may communicate with the host 2100 using a universal serial bus (USB), a small computer system interface (SCSI), a PCI express, an ATA, a parallel ATA (PATA), a serial ATA (SATA) and a serial attached ACSI (SAS). The host interface 2212 may perform a function of a disk emulation supporting so that the host 2100 recognizes the SSD 220 as a hard disk HDD.

The central processing unit (CPU) 2214 analyses and processes a signal SGL inputted from the host 2100. The central processing unit (CPU) 2214 controls the host interface 2212 or the nonvolatile memories 2201-220n through the host interface 2212 or the NVM interface 2211. The central processing unit (CPU) 2214 controls operations of the NVM interface 2211 according to a firmware for driving the SSD 2200.

The buffer memory 2215 temporally stores writing data provided from the host 2100 or data read from the nonvolatile memory devices 2201-220n. The buffer memory 2215 may store meta data or cache data to be stored in the nonvolatile memory devices 2201-220n. When a sudden power off operation is performed, meta data or cache data stored in the buffer memory 2215 are stored in the nonvolatile memory devices 2201-220n. The buffer memory 2215 may be a DRAM or a SRAM.

The SSD 2000 illustrated in FIGS. 11 and 12 may support the voltage correction operation described before.

Figure 13:
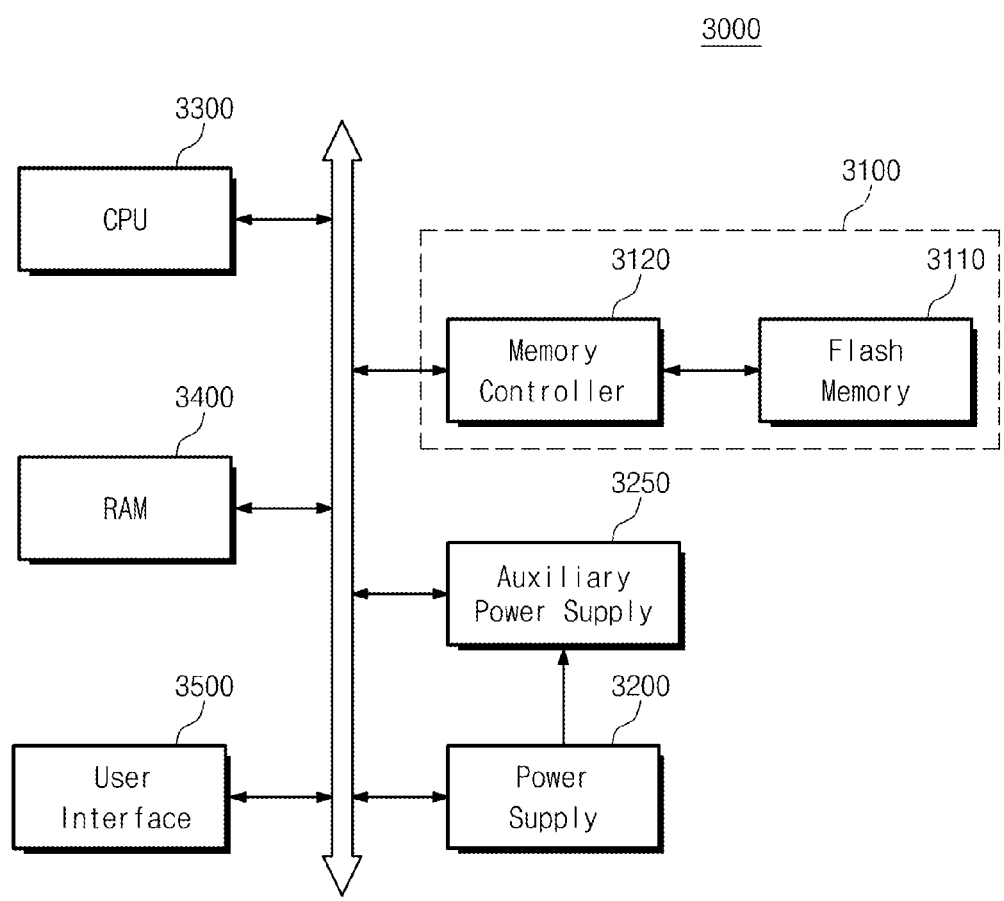
FIG. 13 is a block diagram illustrating an example of embodying a voltage correction operation in accordance with some embodiments of the inventive concept in a flash memory module.

FIG. 13 is a block diagram illustrating an example of embodying a voltage correction operation in accordance with some embodiments of the inventive concept in a flash memory module. A flash memory module 3100 may be used to be connected to a personal computer PC, a notebook computer, a cell phone, a personal digital assistant and a camera.

Referring to FIG. 13, the flash memory module 3000 includes a memory system 3100, a power supply 3200, an auxiliary power supply 3250, a central processing unit (CPU) 3300, a RAM 3400 and a user interface 3500. The flash memory module 3000 illustrated in FIG. 13 may support a voltage correction operation.

The scope of the inventive concept is not limited to only the illustrated embodiments and many modifications are possible without materially departing from the novel teachings and advantages described above.

For example, in the embodiments described above, the semiconductor memory device having a nonvolatile memory is described as an illustration. However, the semiconductor memory device may be applied to semiconductor memory devices having a CLS noise such that a voltage of common source line increases.

In certain embodiments, the constitution that a pre-charge voltage applied to a bit line BL and a read voltage applied to a word line WL may be corrected as described. However, only a read voltage applied to a word line WL may be corrected according to the number of fail cells and inhibit cells.

According to the inventive concept, when reading data from a memory cell in a memory string, an effect of voltage increase (CSL noise) of common source line by a current flowing from the memory string to the common source line may be reduced by correcting a voltage applied to the memory cell. Thus, a time required to perform a program verification repeating a read operation and a write operation may be shortened while maintaining the degree of accuracy of reading data without preparing a dummy read period suppressing a voltage increase of common source line.

The above-disclosed subject matter is to be considered illustrative, and not restrictive, and the appended claims are intended to cover all such modifications, enhancements, and other embodiments, which fall within the scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor memory device comprising:
   a memory cell array including a plurality of memory strings, each memory string including memory cells series-connected between a string select transistor and a ground select transistor, wherein the ground select transistor is connected to a common source line (CSL);
   a plurality of word lines including a selected word line, wherein the selected word line is commonly connected to gates of a row of memory cells extending across the plurality of memory strings;
   a plurality of bit lines including a selected bit line, wherein each one of the plurality of bit lines is connected to a corresponding one of the plurality of memory strings;
   a page buffer that programs data in selected memory cells associated with at least one of the selected word line and the selected bit line during a program operation, and that reads the programmed data from the selected memory cells during a verify read operation of a program verification operation;
   a fail bit counter that determines a number of fail cells among the selected memory cells based on the read data;
   a voltage controller that generates a read voltage applied to the selected word line during the verify read operation and a pre-charge voltage applied to selected bit line during the read verify operation; and
   a control circuit that controls the voltage controller to correct at least one of the read voltage and the pre-charge voltage to be applied during a subsequent verify read operation of the program verification operation in response to the number of fail cells.

2. The semiconductor memory device of claim 1, wherein the number of fail cells determined by the fail bit counter is defined by a voltage level of the CSL, and the control circuit corrects the pre-charge voltage in response to the number of fail cells.

3. The semiconductor memory device of claim 1, wherein the number of fail cells determined by the fail bit counter is defined by a voltage level of the CSL, and the control circuit corrects the read voltage in response to the number of fail cells.

4. The semiconductor memory device of claim 1, wherein the number of fail cells determined by the fail bit counter is defined by a voltage level of the CSL, and the control circuit corrects the pre-charge voltage and the read voltage in response to the number of fail cells.

5. The semiconductor memory device of claim 1, wherein the control circuit stores a number of inhibit cells and controls the voltage controller in response to the number of inhibit cells and the number of fail cells.

6. The semiconductor memory device of claim 1, further comprising a corrected voltage table that stores correction voltage values, wherein the control circuit controls the voltage controller by referencing at least one correction voltage value in the corrected voltage table in response to the number of fail cells.

7. The semiconductor memory device of claim 6, wherein the control circuit stores a number of inhibit cells and controls the voltage controller in response to the number of inhibit cells and the number of fail cells.

8. The semiconductor memory device of claim 7, wherein the number of fail cells determined by the fail bit counter is defined by a voltage level of the CSL, and the control circuit corrects the pre-charge voltage in response to the number of fail cells and the number of inhibit cells.

9. The semiconductor memory device of claim 7, wherein the number of fail cells determined by the fail bit counter is defined by a voltage level of the CSL, and the control circuit corrects the read voltage in response to the number of fail cells and the number of inhibit cells.

10. The semiconductor memory device of claim 7, wherein the number of fail cells determined by the fail bit counter is defined by a voltage level of the CSL, and the control circuit corrects the pre-charge voltage and the read voltage in response to the number of fail cells and the number of inhibit cells.

11. A method of operating a semiconductor memory device comprises:
    during a program verification operation, applying a read voltage to a selected word line and applying a pre-charge voltage to a selected bit line, and providing output data in response to the read voltage and pre-charge voltage;
    determining a number of fail cells in view of the output data, wherein the number of fail cells is directly related to an increase in voltage on a common source line (CSL) connected to memory cells providing the output data; and
    during a subsequent program verification operation, adjusting at least one of the read voltage and the pre-charge voltage in response to the number of fail cells.

12. The method of claim 11, wherein both of the read voltage and the pre-charge voltage are adjusted in response to the number of fail cells.

13. The method of claim 11, wherein the number of fail cells is determined further in view of a number of inhibit cells.

14. The method of claim 13, wherein the number of fail cells is determined with reference to a corrected voltage table storing correction voltage values.

15. A system comprising:
    a controller that controls the operation of a semiconductor memory device, wherein the semiconductor memory device comprises:
    a memory cell array including a plurality of memory strings, each memory string including memory cells series-connected between a string select transistor and a ground select transistor, wherein the ground select transistor is connected to a common source line (CSL);
    a plurality of word lines including a selected word line, wherein the selected word line is commonly connected to gates of a row of memory cells extending across the plurality of memory strings;

a plurality of bit lines including a selected bit line, wherein each one of the plurality of bit lines is connected to a corresponding one of the plurality of memory strings;

a page buffer that programs data in selected memory cells associated with at least one of the selected word line and the selected bit line during a program operation, and that reads the programmed data from the selected memory cells during a verify read operation of a program verification operation;

a fail bit counter that determines a number of fail cells among the selected memory cells based on the read data;

a voltage controller that generates a read voltage applied to the selected word line during the verify read operation and a pre-charge voltage applied to selected bit line during the read verify operation; and a control circuit that controls the voltage controller to correct at least one of the read voltage and the pre-charge voltage to be applied during a subsequent verify read operation of the program verification operation in response to the number of fail cells.

16. The system of claim 15, wherein the number of fail cells determined by the fail bit counter is defined by a voltage level of the CSL, and the control circuit corrects the pre-charge voltage in response to the number of fail cells.

17. The system of claim 15, wherein the number of fail cells determined by the fail bit counter is defined by a voltage level of the CSL, and the control circuit corrects the read voltage in response to the number of fail cells.

18. The system of claim 15, wherein the number of fail cells determined by the fail bit counter is defined by a voltage level of the CSL, and the control circuit corrects the pre-charge voltage and the read voltage in response to the number of fail cells.

19. The system of claim 18, wherein the control circuit stores a number of inhibit cells and controls the voltage controller in response to the number of inhibit cells and the number of fail cells.

20. The system of claim 15, further comprising:
a corrected voltage table that stores correction voltage values, wherein the control circuit controls the voltage controller by referencing at least one correction voltage value in the corrected voltage table in response to the number of fail cells.

* * * * *